(12) United States Patent
Park et al.

(10) Patent No.: US 10,324,321 B2
(45) Date of Patent: Jun. 18, 2019

(54) DISPLAY DEVICE

(71) Applicant: SAMSUNG DISPLAY CO., LTD., Yongin-si, Gyeonggi-do (KR)

(72) Inventors: Seunghyun Park, Seoul (KR); Sungjin Kim, Seongnam-si (KR); Junho Song, Seongnam-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/654,957

(22) Filed: Jul. 20, 2017

(65) Prior Publication Data
US 2018/0024392 A1 Jan. 25, 2018

(30) Foreign Application Priority Data

Jul. 21, 2016 (KR) .................. 10-2016-0092571

(51) Int. Cl.
*G02F 1/136* (2006.01)
*G02F 1/1333* (2006.01)
*G02F 1/1362* (2006.01)
*G02F 1/1335* (2006.01)
*H01L 51/52* (2006.01)
*H01L 27/32* (2006.01)
*H01L 51/00* (2006.01)
*G02F 1/135* (2006.01)

(52) U.S. Cl.
CPC .... *G02F 1/13336* (2013.01); *G02F 1/133553* (2013.01); *G02F 1/136227* (2013.01); *G02F 1/136286* (2013.01); *H01L 27/3248* (2013.01); *H01L 27/3276* (2013.01); *H01L 51/5218* (2013.01); *H01L 51/5284* (2013.01); *G02F 2001/1351* (2013.01); *H01L 51/0002* (2013.01)

(58) Field of Classification Search
CPC .................. G02F 1/136227; G02F 1/136286
USPC .......................................................... 349/43
See application file for complete search history.

(56) References Cited

U.S. PATENT DOCUMENTS 6,661,485 B2   12/2003   Moon
6,757,038 B2    6/2004   Itoh et al.
6,940,572 B2    9/2005   Kang et al.
(Continued)

FOREIGN PATENT DOCUMENTS

KR      2002-0065791 A    8/2002
KR   10-2004-0036784 A    5/2004
(Continued)

*Primary Examiner* — Christopher M Raabe
(74) *Attorney, Agent, or Firm* — Lee & Morse, P.C.

(57) ABSTRACT

A display device includes a first substrate spaced from a second substrate, a gate line, a first data line, and a second data line on the first substrate, a first switch connected to the gate line and the first data line, a second switch connected to the gate line and the second data line, a first pixel electrode connected to the first switch, and a second pixel electrode connected to the second switch. The second pixel electrode is adjacent to the first pixel electrode. The first gate line extends in a first direction. A first light emission area positioned corresponding to the first pixel electrode and a second light emission area positioned corresponding to the second pixel electrode are adjacent to each other in the first direction. The second data line and the second switch are in the first light emission area.

23 Claims, 13 Drawing Sheets

(56) References Cited

U.S. PATENT DOCUMENTS

| | | | | |
|---|---|---|---|---|
| 2004/0135149 A1* | 7/2004 | Cho | ................ | G02F 1/133514 257/72 |
| 2008/0088754 A1* | 4/2008 | Hu | .................. | G02F 1/133555 349/33 |
| 2010/0283714 A1* | 11/2010 | Cho | .................. | G02F 1/13454 345/90 |

FOREIGN PATENT DOCUMENTS

| KR | 10-2004-0060011 A | 7/2004 |
|---|---|---|
| KR | 10-2005-0097909 A | 10/2005 |

\* cited by examiner

FIG. 12A

|  | REFLECTIVITY OF EACH COLOR FILTER BASED ON BaSO4 RATIO | REFLECTIVITY OF EACH COLOR FILTER | AREA OF DARK PORTION | REFLECTIVITY INCLUDING DARK PORTION |
|---|---|---|---|---|
| W | 78.91 | 49% | 3% | 48% |
| R | 31.19 | 19% | 3% | 18% |
| G | 42.54 | 27% | 3% | 26% |
| B | 7.79 | 5% | 3% | 5% |
| Sum |  | 100% |  | 97% |

FIG. 12B

|  | REFLECTIVITY OF EACH COLOR FILTER BASED ON BaSO4 RATIO | REFLECTIVITY OF EACH COLOR FILTER | AREA OF DARK PORTION | REFLECTIVITY INCLUDING DARK PORTION |
|---|---|---|---|---|
| W | 78.91 | 49% | 0% | 49% |
| R | 31.19 | 19% | 0% | 19% |
| G | 42.54 | 27% | 0% | 27% |
| B | 7.79 | 5% | 12% | 4% |
| Sum |  | 100% |  | 99% |

FIG. 13A

| | REFLECTIVITY OF EACH COLOR FILTER BASED ON BaSO4 RATIO | REFLECTIVITY OF EACH COLOR FILTER | AREA OF DARK PORTION | REFLECTIVITY INCLUDING DARK PORTION |
|---|---|---|---|---|
| R | 31.19 | 38% | 3% | 37% |
| G | 42.54 | 52% | 3% | 51% |
| B | 7.79 | 10% | 3% | 9% |
| Sum | | 100% | | 97% |

FIG. 13B

| | REFLECTIVITY OF EACH COLOR FILTER BASED ON BaSO4 RATIO | REFLECTIVITY OF EACH COLOR FILTER | AREA OF DARK PORTION | REFLECTIVITY INCLUDING DARK PORTION |
|---|---|---|---|---|
| R | 31.19 | 38% | 0% | 38% |
| G | 42.54 | 52% | 0% | 52% |
| B | 7.79 | 10% | 12% | 8% |
| Sum | | 100% | | 99% |

DISPLAY DEVICE

CROSS-REFERENCE TO RELATED APPLICATION

Korean Patent Application No. 10-2016-0092571, filed on Jul. 21, 2016, and entitled, "Display Device," is incorporated by reference herein in its entirety.

BACKGROUND

1. Field

One or more embodiments described herein relate to a display device.

2. Description of the Related Art

A liquid crystal display (LCD) is one of most widely used types of flat panel displays. An LCD device has a liquid crystal layer between two substrates that include electrodes. When voltages are applied to the electrodes, liquid crystal molecules in the liquid crystal layer are rearranged to control the transmission of light.

SUMMARY

In accordance with one or more embodiments, a display device includes a first substrate spaced from a second substrate; a gate line, a first data line, and a second data line on the first substrate; a first switch connected to the gate line and the first data line; a second switch connected to the gate line and the second data line; a first pixel electrode connected to the first switch; and a second pixel electrode connected to the second switch, the second pixel electrode adjacent to the first pixel electrode, wherein the first gate line extends in a first direction, a first light emission area positioned corresponding to the first pixel electrode and a second light emission area positioned corresponding to the second pixel electrode are adjacent to each other in the first direction, and the second data line and the second switch are in the first light emission area.

The display device may include a light blocking layer on one of the first substrate or the second substrate, wherein the light blocking layer defines the first light emission area of the first pixel electrode and the second light emission area of the second pixel electrode. The second data line may overlap the first pixel electrode in the first light emission area. The first switch may be in the first light emission area. The first switch and the second switch may not overlap the light blocking layer.

The display device may include a color filter layer on one of the first substrate or the second substrate. The color filter layer may include a first color filter corresponding to the first pixel electrode and a second color filter corresponding to the second pixel electrode. The first color filter may be a blue color filter. The first color filter and the second color filter may have different colors. The first data line may overlap the first pixel electrode. The first data line and the second data line may not overlap the second pixel electrode.

The display device may include a third data line on the first substrate; a third switch connected to the gate line and the third data line; and a third pixel electrode connected to the third switching element and adjacent to the first pixel. The first data line may be between the second data line and the third data line. The third data line may overlap the first pixel electrode.

The display device may include a light blocking layer on one of the first substrate or the second substrate, wherein the light blocking layer defines a first light emission area of the first pixel electrode, a second light emission area of the second pixel electrode, and a third light emission area of the third pixel electrode, and wherein the third data line overlaps the first pixel electrode in the first light emission area. The first switch may be between the second switch and the third switch. The first pixel electrode may be between the second pixel electrode and the third pixel electrode. The display device may include a reflective electrode overlapping the first pixel electrode and the second pixel electrode. The reflective electrode may receive a constant direct current voltage.

The display device may include a first unit reflective electrode overlapping the first pixel electrode; and a second unit reflective electrode overlapping the second pixel electrode, wherein the second unit reflective electrode is electrically separated from the first unit reflective electrode. The first unit reflective electrode may be connected to the first switching element and the first pixel electrode, and the second unit reflective electrode may be connected to the second switching element and the second pixel electrode. The display device may include a reflective electrode between the first data line and the second data line, wherein the reflective electrode overlaps the first pixel electrode.

BRIEF DESCRIPTION OF THE DRAWINGS

Features will become apparent to those of skill in the art by describing in detail exemplary embodiments with reference to the attached drawings in which:

FIGS. 12A and 12B illustrate examples of reflectivity of a proposed display device and an embodiment of a display device; and FIGS. 13A and 13B illustrate examples of reflectivity of another proposed display device and an embodiment of a display device.

DETAILED DESCRIPTION

Figure 1:
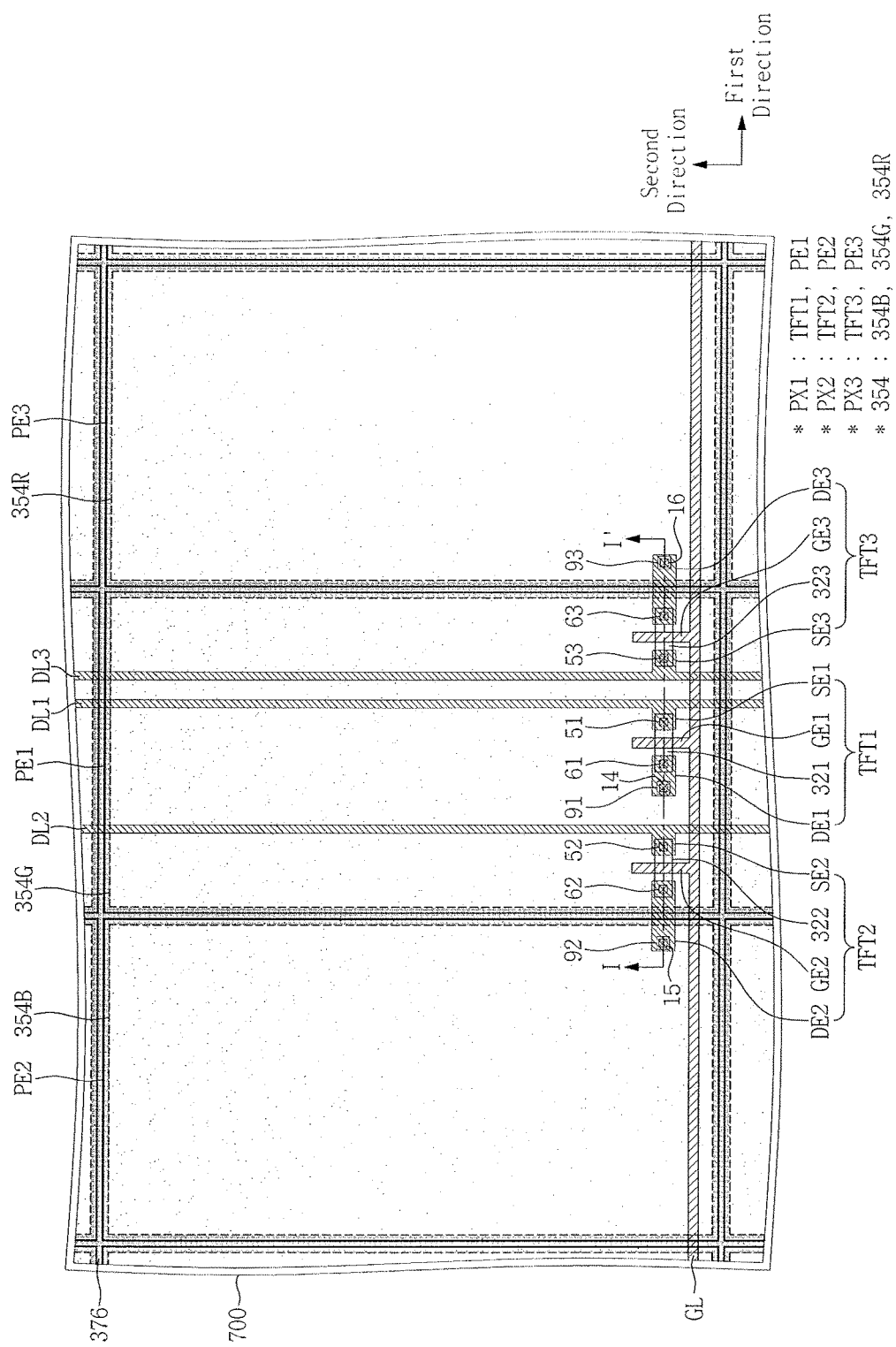
FIG. 1 illustrates an embodiment of a display device.

Example embodiments will be described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
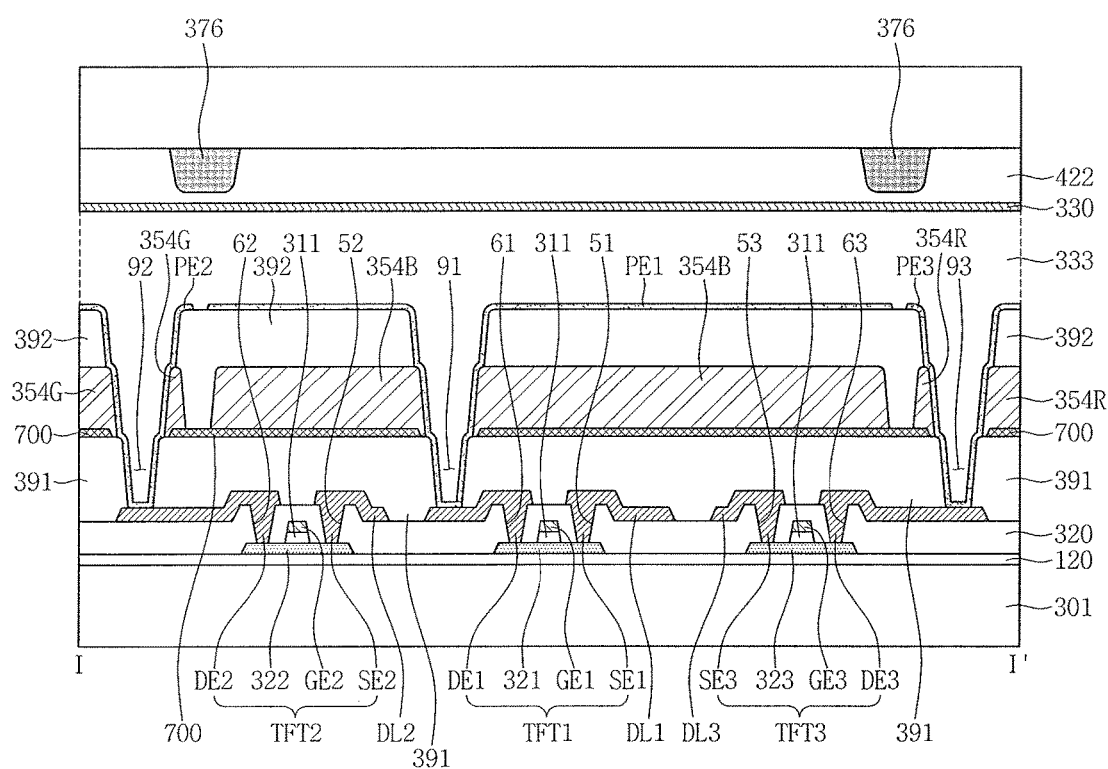
FIG. 2 illustrates a view taken along section line I-I' in FIG. 1.

FIG. 1 illustrates an embodiment of a display device, and FIG. 2 illustrates a cross-sectional view taken along line I-I' in FIG. 1. The display device may be a reflective display device including a reflective electrode 700.

Referring to FIGS. 1 and 2, the display device includes a plurality of pixels, a plurality of gate lines GL1 and GL2, a plurality of data lines DL1, DL2, and DL3, a buffer layer 120, a gate insulating layer 311, an insulating interlayer 320, a first organic layer 391, a reflective electrode 700, a color filter layer 354, a second organic layer 392, a plurality of pixel electrodes PE1, PE2, and PE3, a second substrate 302, a light blocking layer 376, an overcoat layer 422, a common electrode 330, and a liquid crystal layer 333. In FIG. 1, first and second directions are illustrated.

A first pixel PX1 may include a pixel electrode PE1 in an intermediate portion of FIG. 1, a second pixel PX2 including a pixel electrode PE2 on a left side in FIG. 1, and a third pixel PX3 including a pixel electrode PE3 on a right side in FIG. 1. The first, second, and third pixels PX1, PX2, and PX3 may emit light corresponding to a red image, a green image, or a blue image. For example, the first pixel PX1 may emit blue image light. The second pixel PX2 may green image light. The third pixel PX3 may emit red image light. In an exemplary embodiment, the display device may include a pixel emitting a white image light in addition to or in place of the aforementioned pixels.

The first pixel PX1 includes a first switching element TFT1 and a first pixel electrode PE1. The first switching element TFT1 may be a thin film transistor. For example, the first switching element TFT1 includes a first semiconductor layer 321, a first gate electrode GE1, a first source electrode SE1, and a first drain electrode DE1. The first gate electrode GE1 is connected to a gate line GL, the first source electrode SE1 is connected to a first data line DLL, and the first drain electrode DE1 is connected to the first pixel electrode PE1.

The second pixel PX2 includes a second switching element TFT2 and a second pixel electrode PE2. The second switching element TFT2 may be a thin film transistor. The second switching element TFT2 includes a second semiconductor layer 322, a second gate electrode GE2, a second source electrode SE2, and a second drain electrode DE2. The second gate electrode GE2 is connected to the gate line GL, the second source electrode SE is connected to a second data line DL2, and the second drain electrode DE2 is connected to the second pixel electrode PE2.

The third pixel PX3 includes a third switching element TFT3 and a third pixel electrode PE3. The third switching element TFT3 may be a thin film transistor. The third switching element TFT3 includes a third semiconductor layer 323, a third gate electrode GE3, a third source electrode SE3, and a third drain electrode DE3. The third gate electrode GE3 is connected to the gate line GL, the third source electrode SE3 is connected to a third data line DL3, and the third drain electrode DE3 is connected to the third pixel electrode PE3.

A first substrate 301 is spaced apart from the second substrate 302 by a predetermined distance. The first substrate 301 may include an insulating material including, for example, glass, quartz, ceramic, or plastic. The second substrate 302 may include a same material as a material in the first substrate 301.

The buffer layer 120 is on the first substrate 301. In one embodiment, the buffer layer 120 may be over an entire surface of the first substrate 301. The buffer layer 120 may include at least one layer of various inorganic layers and organic layers. In one embodiment, the buffer layer 120 may be omitted.

The first semiconductor layer 321, the second semiconductor layer 322, and the third semiconductor layer 323 are on the buffer layer 120. The first semiconductor layer 321, the second semiconductor layer 322, and the third semiconductor layer 323 are at different portions of the buffer layer 120, respectively.

The first semiconductor layer 321 may include amorphous silicon, polycrystalline silicon, or the like. The first semiconductor layer 321 may include or be formed of one of polycrystalline silicon and/or an oxide semiconductor such as but not limited to indium gallium zinc oxide (IGZO) or indium zinc tin oxide (IZTO).

The second semiconductor layer 322 and the third semiconductor layer 323 may include the same material as and may have substantially a same structure (e.g., a multilayer structure) as the first semiconductor layer 321. The first, second, and third semiconductor layers 321, 322, and 323 may be simultaneously provided in substantially a same process.

The gate insulating layer 311 is on the first semiconductor layer 321, the second semiconductor layer 322, and the third semiconductor layer 323. The gate insulating layer 311 overlaps each of a channel area of the first semiconductor layer 321, a channel area of the second semiconductor layer 322, and a channel area of third semiconductor layer 323.

The gate insulating layer 311 may include or be formed of silicon nitride (SiNx) or silicon oxide (SiOx). The gate insulating layer 311 may have a multilayer structure including at least two insulating layers having different physical properties.

The gate line GL and the first gate electrode GE1, second gate electrode GE2, and third gate electrode GE3 are on the gate insulating layer 311. The first gate electrode GE1 overlaps the channel area of the first semiconductor layer 321, the second gate electrode GE2 overlaps the channel area of the second semiconductor layer 322, and the third gate electrode GE3 overlaps the channel area of the third semiconductor layer 323.

The first gate electrode GE1, the second gate electrode GE2, and the third gate electrode GE3 may be unitary with the gate line GL. The gate line GL extends in a first direction. The first gate electrode GE1 may protrude from the gate line GL toward the first semiconductor layer 321. The second gate electrode GE2 may protrude from the gate line GL toward the second semiconductor layer 322. The third gate electrode GE3 may protrude from the gate line GL toward the third semiconductor layer 323.

The gate line GL may include or be formed of aluminum (Al) or alloys thereof, silver (Ag) or alloys thereof, copper (Cu) or alloys thereof, and/or molybdenum (Mo) or alloys thereof. In one exemplary embodiment, the gate line GL may include or be formed of one of chromium (Cr), tantalum (Ta), or titanium (Ti). In an exemplary embodiment, the gate line GL may have a multilayer structure including at least two conductive layers of different physical properties.

The first gate electrode GE1, the second gate electrode GE2, and the third gate electrode GE3 may include a same material and/or may have a same structure (e.g., a multilayer structure) as the gate line GL. The first, second, and third gate electrodes GE1, GE2, and GE3 may be simultaneously provided in a same process.

The insulating interlayer 320 is on the first gate electrode GE1, second gate electrode GE2, third gate electrode GE3, first semiconductor layer 321, second semiconductor layer 322, third semiconductor layer 323, and buffer layer 120.

The insulating interlayer 320 includes a first source contact hole 51 in a first source area of the first semiconductor layer 321, a first drain contact hole 61 in a first drain area of the first semiconductor layer 321, a second source contact hole 52 in a second source area of the second semiconductor layer 322, a second drain contact hole 62 in a second drain area of the second semiconductor layer 322, a third source contact hole 53 in a third source area of the third semiconductor layer 323, and a third drain contact hole 63 in a third drain area of the third semiconductor layer 323. The insulating interlayer 320 may include a same material and/or may have a same structure (e.g., a multilayer structure) as the gate insulating layer 311.

In an exemplary embodiment, a lightly doped drain ("LDD") area may be between the channel area of the first semiconductor layer 321 and the first source area thereof and between the channel area of the first semiconductor layer 321 and the first drain area thereof. Each of the second semiconductor layer 322 and the third semiconductor layer 323 may further include the LDD area.

The first data line DL1, second data line DL2, third data line DL3, first source electrode SE1, first drain electrode DE1, second source electrode SE2, second drain electrode DE2, third source electrode SE3, and third drain electrode DE3 may be on the insulating interlayer 320.

Each of the first, second, and third data lines DL1, DL2, and DL3 may extend in a second direction and intersect the gate line GL. A portion of each of the first, second, and third data lines DL1, DL2, and DL3 intersecting the gate line GL may have a smaller line width than a line width of another portion of the first, second, and third data lines DL1, DL2, and DL3, respectively. The gate line GL intersecting the first, second, and third data lines DL1, DL2, and DL3 may have a smaller line width than a line width of another portion of the gate line GL. Accordingly, parasitic capacitance corresponding to first, second, and third data lines DL1, DL2, and DL3 and gate line GL may be reduced.

The first data line DL1 may include or be formed of a refractory metal, such as but not limited to molybdenum, chromium, tantalum, or titanium, and/or an alloy thereof. In one embodiment, the first data line DL1 may have a multilayer structure including a refractory metal layer and a low-resistance conductive layer. Examples of the multilayer structure include a double-layer structure or a triple-layer structure. The double-layer structure may include, for example, a chromium or molybdenum (alloy) lower layer and an aluminum (alloy) upper layer. The triple-layer structure may include, for example, a molybdenum (alloy) lower layer, an aluminum (alloy) intermediate layer, and a molybdenum (alloy) upper layer. In an exemplary embodiment, the first data line DL1 may include or be formed of one or more metals and/or conductors instead of or in addition to the aforementioned materials.

The second data line DL2 and the third data line DL3 may include a same material and/or may have a same structure (e.g., a multilayer structure) as the first data line DL1. The first, second, and third data lines DL1, DL2, and DL3 may be simultaneously provided in a same process.

The first source electrode SE1 and the first data line DL1 may have a unitary construction, the second source electrode SE2 and the second data line DL2 may have a unitary construction, and the third source electrode SE3 and the third data line DL3 may have a unitary construction.

The first source electrode SE1 may protrude from the first data line DL1 toward the first semiconductor layer 321. The second source electrode SE2 may protrude from the second data line DL2 toward the second semiconductor layer 322. The third source electrode SE3 may protrude from the third data line DL3 toward the third semiconductor layer 323.

The first source electrode SE1 is connected to the first source area of the first semiconductor layer 321 through the first source contact hole 51 of the insulating interlayer 320. The first drain electrode DE1 is connected to the first drain area of the first semiconductor layer 321 through the first drain contact hole 61 of the insulating interlayer 320. The second source electrode SE2 is connected to the second source area of the second semiconductor layer 322 through the second source contact hole 52 of the insulating interlayer 320. The second drain electrode DE2 is connected to the second drain area of the second semiconductor layer 322 through the second drain contact hole 62 of the insulating interlayer 320. The third source electrode SE3 is connected to the third source area of the third semiconductor layer 323 through the third source contact hole 53 of the insulating interlayer 320. The third drain electrode DE3 is connected to the third drain area of the third semiconductor layer 323 through the third drain contact hole 63 of the insulating interlayer 320.

The first, second, and third source electrodes SE1, SE2, and SE3 and the first, second, and third drain electrodes DE1, DE2, and DE3 may include a same material and/or may have a same structure (e.g., a multilayer structure) as the first data line DL1. The first, second, and third source electrodes SE1, SE2, and SE3, the first, second, and third drain electrodes DE1, DE2, and DE3, and the first data line DL1 may be simultaneously provided in a same process.

The first organic layer 391 is on the first, second, and third data lines DL1, DL2, and DL3, the first, second, and third source electrodes SE1. SE2, and SE3, the first, second, and third drain electrodes DE1, DE2, and DE3, and the insulating interlayer 320. The first organic layer 391 may include a hole (e.g., a first hole) on the first drain electrode DE1, a hole (e.g., a second hole) on the second drain electrode DE2, and a hole (e.g., a third hole) on the third drain electrode DE3.

The reflective electrode 700 is on the first organic layer 391 and may include a hole (e.g., a fourth hole 14 as in FIG.

4) above the first hole of the first organic layer 391, a hole (e.g., a fifth hole 15 as in FIG. 4) above the second hole of the first organic layer 391, and a hole (e.g., a sixth hole 16 as in FIG. 4) above the third hole of the first organic layer 391. The fourth hole 14 may be larger than the first hole. The fifth hole 15 may be larger than the second hole. The sixth hole 16 may be larger than the third hole.

The reflective electrode 700 may receive a direct current (DC) voltage from a power supply. For example, the reflective electrode 700 may receive a common voltage from the power supply.

Figure 3:
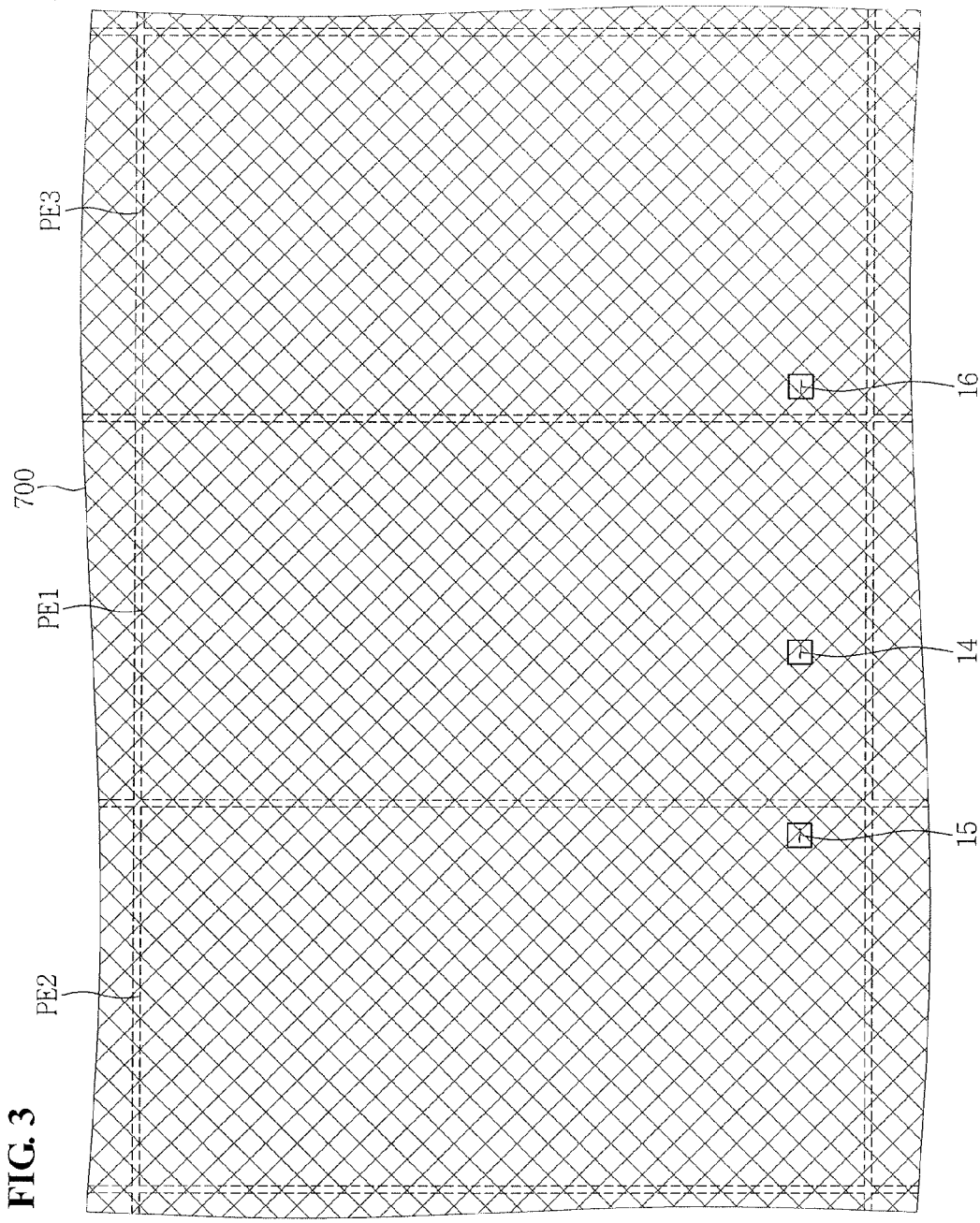
FIG. 3 illustrates an embodiment of a reflective electrode of FIG. 2.

FIG. 3 illustrating an embodiment of reflective electrode 700 of FIG. 2. The first, second, and third pixel electrodes PE1, PE2, and PE3 are illustrated in FIG. 3 to better describe an example of a shape of the reflective electrode 700, and to facilitate understanding of an overall shape of an example of the reflective electrode 700. The first, second, and third pixel electrodes PE1, PE2, and PE3 correspond to a dotted line.

Referring to FIG. 3, the reflective electrode 700 is over an entire surface of the first substrate 301 including the first organic layer 391. The reflective electrode 700 includes the fourth hole 14, the fifth hole 15, and the sixth hole 16 as described above. In an exemplary embodiment, the fourth hole 14 corresponds to the first contact hole 91, fifth hole 15 corresponds to the second contact hole 92, and sixth hole 16 corresponds to the third contact hole 93.

The color filter layer 354 is on the reflective electrode 700 and the first organic layer 391 and on respective inner walls of the fourth, fifth, and sixth holes 14, 15, and 16 of the reflective electrode 700. The color filter layer 354 may include, for example, a blue color filter 354B, a green color filter 354G, and a red color filter 354R. The blue color filter 354B corresponds to the first pixel electrode PE1, the green color filter 354G corresponds to the second pixel electrode PE2, and the red color filter 354R corresponds to the third pixel electrode PE3.

The color filter layer 354 includes a hole (e.g., a seventh hole) above the fourth hole 14 of the reflective electrode 700, a hole (e.g., an eighth hole) above the fifth hole 15 of the reflective electrode 700, and a hole (e.g., a ninth hole) above the sixth hole 16 of the reflective electrode 700. The seventh hole may be larger than the first hole and less than the fourth hole 14. The eighth hole may be larger than the second hole and less than the fifth hole 15. The ninth hole may be larger than the third hole and less than the sixth hole 16. In an exemplary embodiment, the color filter layer 354 may be on the second substrate 302.

The second organic layer 392 is on the color filter layer 354 and may include a hole (e.g., a tenth hole) above the seventh hole of the color filter layer 354, a hole (e.g., an eleventh hole) above the eighth hole of the color filter layer 354, and a hole (e.g., a twelfth hole) above the ninth hole of the color filter layer 354. The tenth hole may be larger than the seventh hole. The eleventh hole may be larger than the eighth hole. The twelfth hole may be larger than the ninth hole.

The first, seventh, and tenth holes may collectively correspond to the first contact hole 91 exposing the first drain electrode DE1. The second, eighth, and eleventh holes may collectively correspond to the second contact hole 92 exposing the second drain electrode DE2. The third, ninth, and twelfth holes may collectively correspond to the third contact hole 93 exposing the third drain electrode DE3.

The first, second, and third pixel electrodes PE1, PE2, and PE3 are on the second organic layer 392. The first pixel electrode PE1 may correspond to a first light emission area 111a (e.g., refer to FIG. 4) of the light blocking layer 376.

The second pixel electrode PE2 may correspond to a second light emission area 111b (e.g., refer to FIG. 4) of the light blocking layer 376. The third pixel electrode PE3 may correspond to a third light emission area 111c (e.g., refer to FIG. 4) of the light blocking layer 376. An edge of the first pixel electrode PE1, an edge of the second pixel electrode PE2, and an edge of the third pixel electrode PE3 may overlap the light blocking layer 376.

The second light emission area 111b is adjacent to the first light emission area 111a in the first direction. The third light emission area 111c is adjacent to the first light emission area 111a in the first direction.

The first pixel electrode PE1 is connected to the first drain electrode DE1 through the first contact hole 91. The second pixel electrode PE2 is connected to the second drain electrode DE2 through the second contact hole 92. The third pixel electrode PE3 is connected to the third drain electrode DE3 through the third contact hole 93.

The first pixel electrode PE1 may include a transparent conductive material, e.g., indium tin oxide (ITO) or indium zinc oxide (IZO). In such an exemplary embodiment, for example, ITO may include a polycrystalline material or a monocrystalline material, and IZO may include a polycrystalline material or a monocrystalline material. In one embodiment, IZO may include an amorphous material.

The second and third pixel electrodes PE2 and PE3 may include a same material and/or may have a same structure (a multilayer structure) as the first pixel electrode PE1. The first, second, and third pixel electrodes PE1, PE2, and PE3 may be simultaneously provided in a same process.

The first pixel electrode PE1 is connected to the first switching element TFT1 and overlaps another switching element in addition to the first switching element TFT1. For example, as in FIG. 1, the first pixel electrode PE1 may overlap the second switching element TFT2 and the third switching element TFT3 in a third direction. In such an exemplary embodiment, the second switching element TFT2 and the third switching element TFT3 may be connected to a data line different from a data line to which the first switching element TFT1 is connected. For example, the first switching element TFT1 is connected to the first data line DL1. The second switching element TFT2 is connected to the second data line DL2. The third switching element TFT3 is connected to the third data line DL3. As such, the first pixel electrode PE1, which is connected to the first data line DL1 through the first switching element TFT1, overlaps the switching elements TFT2 and TFT3 that are connected to the data lines DL2 and DL3, respectively, in the third direction and are different from the first data line DL1.

Accordingly, the second pixel electrode PE2 does not overlap the second data line DL2 or the second switching element TFT2 connected to the second pixel electrode PE2 in the third direction. Also, the third pixel electrode PE3 does not overlap the third data line DL3 or the third switching element TFT3 connected to the third pixel electrode PE3 in the third direction. For example, only a portion of the second drain electrode DE2 overlapping the second semiconductor layer 322 may be substantially defined as an actual second drain electrode DE2 of the second switching element TFT2, In such an exemplary embodiment, the second drain electrode DE2 of the second switching element TFT2 does not overlap the second pixel electrode PE2 in the third direction. For example, only a portion extending from the actual second drain electrode DE2 overlaps the second pixel electrode PE2.

Similarly, only a portion of the third drain electrode DE3 overlapping the third semiconductor layer 323 may be substantially defined as an actual third drain electrode DE3 of the third switching element TFT3. In such an exemplary embodiment, the third drain electrode DE3 of the third switching element TFT3 does not overlap the third pixel electrode PE3. For example, only a portion extending from the actual third drain electrode DE3 overlaps the third pixel electrode PE3 in the third direction.

As illustrated in FIGS. 1 and 2, the first pixel electrode PE1 overlaps opposing sides of the first data line DL1. In addition, the first pixel electrode PE1 overlaps opposing sides of the second data line DL2. The first pixel electrode PE1 overlaps opposing sides of the third data line DL3.

The opposing sides of the first data line DL1 are opposing sides of four sides that correspond to an upper surface of the first data line DL1. The opposing sides (e.g., two long sides) have lengths greater than the other two sides of the fourth sides corresponding to the upper surface of the first data line DL1. In such an exemplary embodiment, as illustrated in FIG. 2, the upper surface of the first data line DL1 corresponds to a surface farthest away from the first substrate 301. For example, the upper surface of the first data line DL1 corresponds to one of surfaces of the first data line DL1 farthest from the first substrate 301.

Similarly, opposing sides of the second data line DL2 are opposing sides of four sides that correspond to an upper surface of the second data line DL2. Opposing sides of the third data line DL3 are opposing sides of four sides that correspond to an upper surface of the third data line DL3.

According to an exemplary embodiment, a switching element (e.g., at least one of the second or third switching elements TFT2 and TFT3) and data lines (e.g., the second or third data lines DL2 and DL3) of one pixel (at least one of the second or third pixels PX2 and PX3) are in another pixel (e.g., the first pixel PX1) adjacent to the one pixel. Thus, a vertical height different (e.g., an unevenness pattern) in the one pixel may be reduced. Accordingly, a dark portion in the one pixel may be reduced. However, a vertical height difference in the other pixel increases so that a dark portion in the other pixel may increase. In such an exemplary embodiment, the other pixel may be, for example, a blue pixel including a blue color filter.

Among a red color filter, a green color filter, and a blue color filter, the blue color filter has the greatest luminance decrease ratio. The green color filter has the smallest luminance decrease ratio. Further, the red color filter has a luminance decrease ratio of about an intermediate level between the greatest and smallest luminance decrease ratios. Thus, the blue color filter has the greatest transmittance, and thus has the greatest luminance decrease ratio. Accordingly, when switching elements of the red pixel and the green pixel are in the blue pixel (which is dark compared to the red pixel and the green pixel), a dark portion of the blue pixel increases. But, a decrease of dark portions of the red pixel and the green pixel is greater than the increase of a dark portion of the blue pixel. As a result, overall luminance of the display device may increase.

Figure 4:
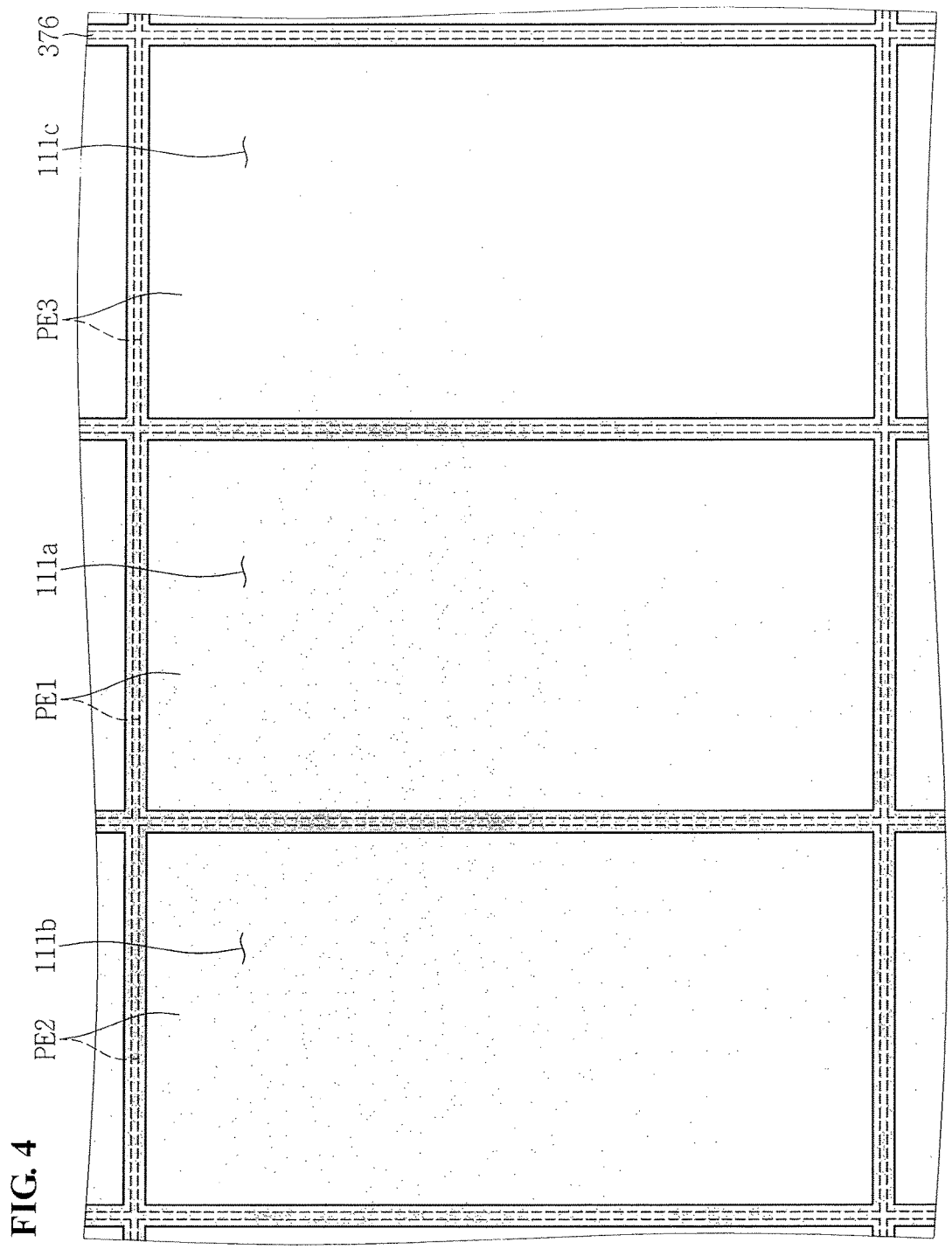
FIG. 4 illustrates an embodiment of a light blocking layer of FIG. 2.

FIG. 4 illustrates an embodiment of the light blocking layer 376, which is on the second substrate 302. In an exemplary embodiment, the light blocking layer 376 may be on the first substrate 301. The light blocking layer 376 corresponds to a light emission area of each pixel electrode. For example, the light blocking layer 376 may define a light emission area (first light emission area 111a) of the first pixel electrode PE1, a light emission area (second light emission area 111b) of the second pixel electrode PE2, and a light emission area (third light emission area 111c) of the third pixel electrode PE3. The light blocking layer 376 prevents light from being emitted toward an area (e.g., a light blocking area) rather than the first, second, and third light emission areas 111a, 111b, and 111c. The light blocking layer 376 is in the light blocking area. The light emission area may also be referred to as a pixel area.

The first data line DL1 connected to the first switching element TFT1 overlaps the first light emission area 111a. The second data line DL2 connected to the second switching element TFT2 and the third data line DL3 connected to the third switching element TFT3 may overlap the first light emission area 111a.

The overcoat layer 422 is on the light blocking layer 376 and the second substrate 302 and over the entire surface of the second substrate 302 including the light blocking layer 376. The overcoat layer 422 planarizes the second substrate 302.

The common electrode 330 is on the overcoat layer 422 and over an entire surface of the second substrate 302 including the overcoat layer 422. The common electrode 330 receives a common voltage from a power supply. The common electrode 330 may include, for example, the same material as the first pixel electrode PE1. In an exemplary embodiment, when each of the first, second, and third pixel electrodes PE1, PE2, and PE3 includes IZO, the common electrode 330 may include ITO.

A first alignment layer may be on the first pixel electrode PE1, the second pixel electrode PE2, the third pixel electrode PE3, and the second organic layer 392. The first alignment layer may be a rubbed alignment layer or an unrubbed alignment layer. A second alignment layer may be on the common electrode 330 and may be a rubbed alignment layer or an unrubbed alignment layer.

The liquid crystal layer 333 is between the first substrate 301 and the second substrate 302. The liquid crystal layer 333 may be, for example, between the first alignment layer of the first substrate 301 and the second alignment layer of the second substrate 302. The liquid crystal layer 333 may include, for example, a nematic liquid crystal material having positive dielectric anisotropy. The liquid crystal molecules of the liquid crystal layer 333 may have a structure in which a major axis thereof is aligned parallel to one of the first substrate 301 and the second substrate 302, and the direction is spirally twisted about 90 degrees from a rubbing direction of the first alignment layer to the second substrate 302.

In another exemplary embodiment, the liquid crystal layer 333 may include a homeotropic liquid crystal material, rather than the nematic liquid crystal material. In such an exemplary embodiment, the first alignment layer may be a homeotropic alignment layer or an alignment layer including a photoreactive material. In addition, the second alignment layer may be a homeotropic alignment layer or a layer that is photo-aligned using a photopolymerizable material. In another exemplary embodiment, the liquid crystal layer 333 may include liquid crystal molecules having negative dielectric anisotropy, rather than the nematic liquid crystal material.

Figure 5:
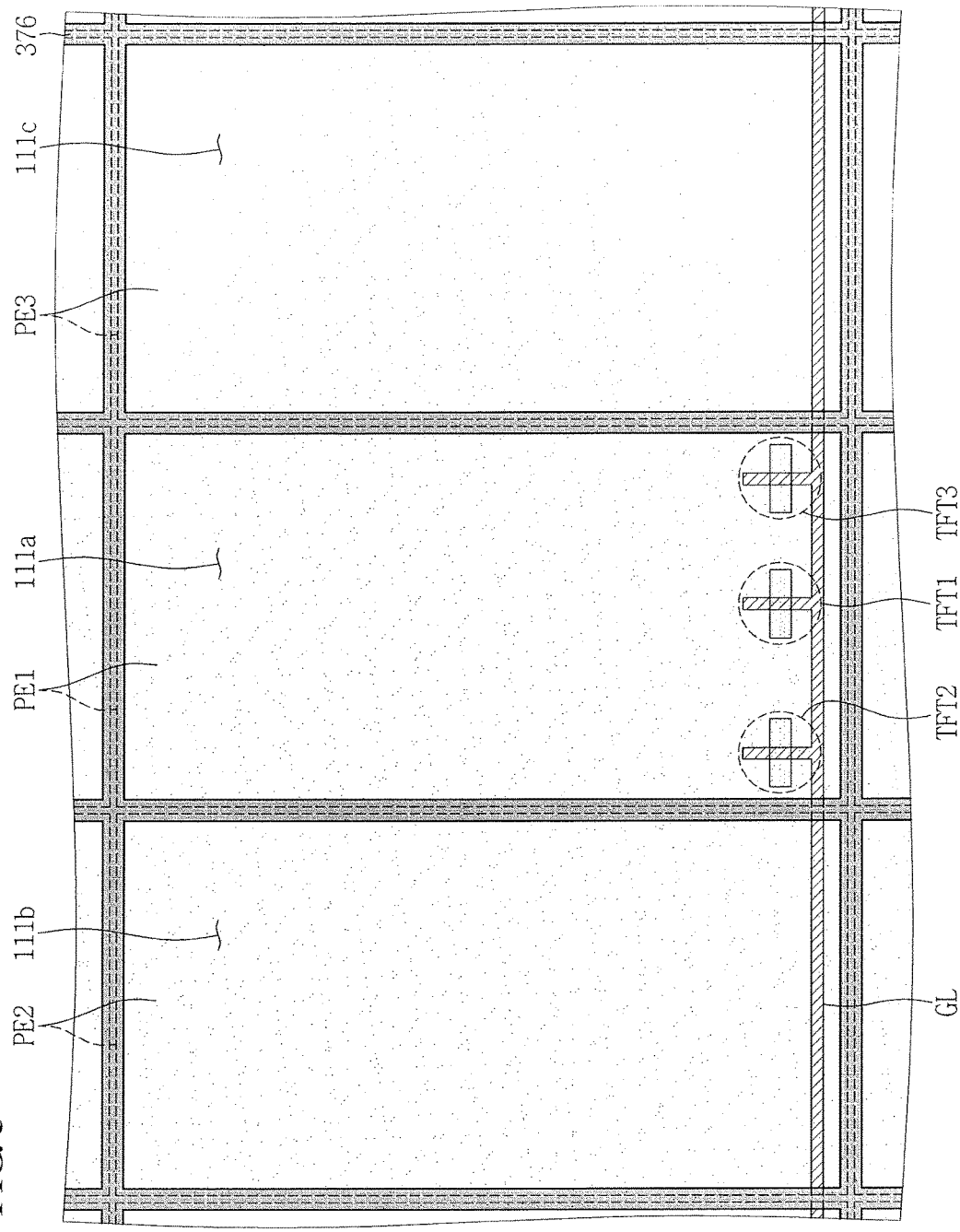
FIG. 5 is a view of FIG. 4 further illustrating a gate line, a first switching element, a second switching element, and a third switching element of FIG. 1.

FIG. 5 illustrates an embodiment of the gate line GL, the first switching element TFT1, the second switching element TFT2, and the third switching element TFT3 of FIG. 1. The first switching element TFT1, the second switching element TFT2, and the third switching element TFT3 may correspond to a single light emission area 111a.

Figure 6:
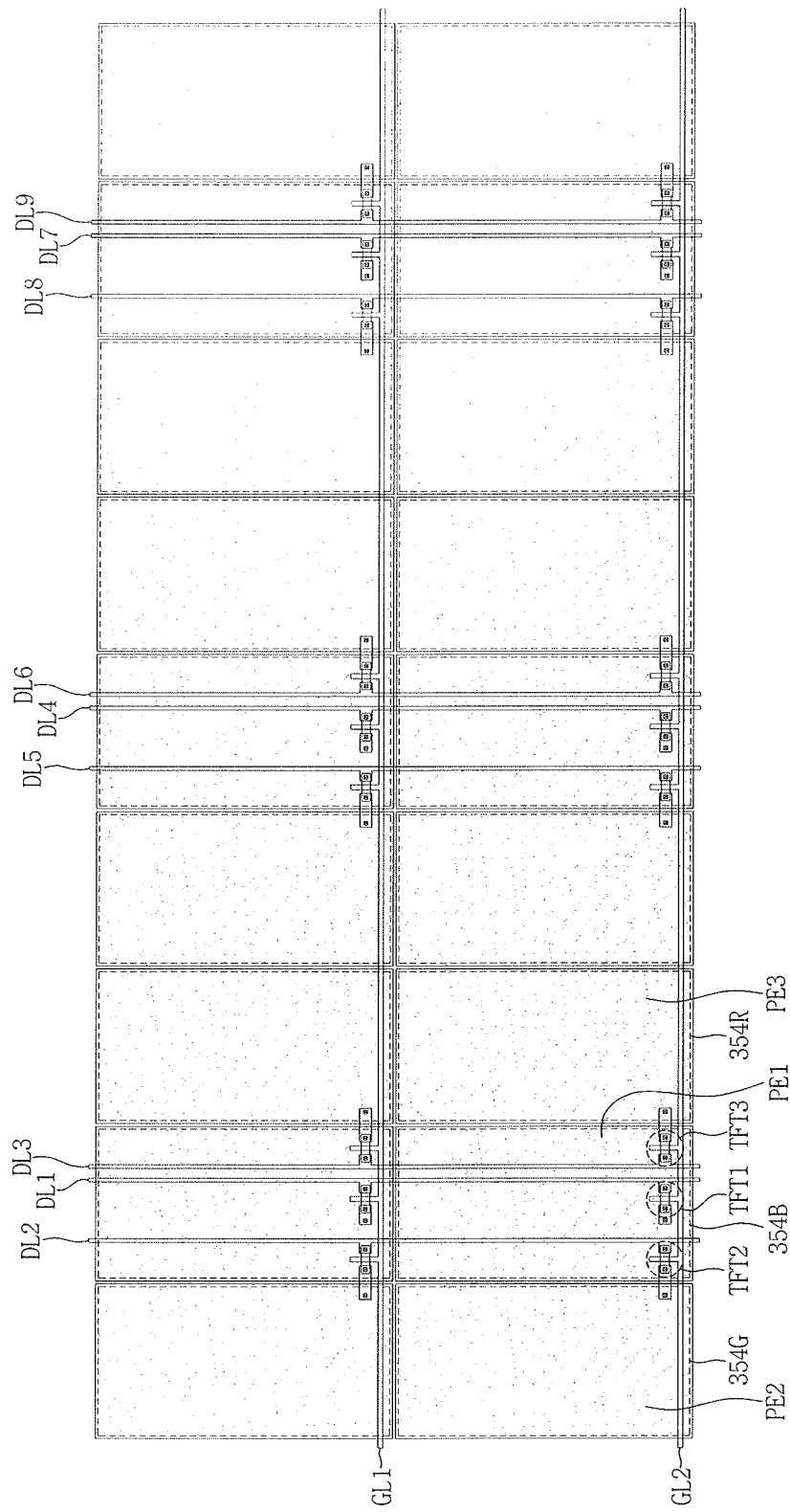
FIG. 6 is a view illustrating disposition of a plurality of pixels connected to a first gate line, a second gate line, and first to ninth data lines.

FIG. 6 illustrates an embodiment of a plurality of pixels connected to a first gate line GL1, a second gate line GL2, and first to ninth data lines DL1 to DL9. The first gate line GL1 of FIG. 6 corresponds to the gate line GL.

Referring to FIG. 6, switching elements of pixels adjacent to a blue pixel connected to the first data line DL1, a blue pixel connected to the fourth data line DL4, and a blue pixel connected to the seventh data line DL7 are in the blue pixel connected to the first data line DL1, the blue pixel connected to the fourth data line DL4, and the blue pixel connected to the seventh data line DL7, respectively.

Figure 7:
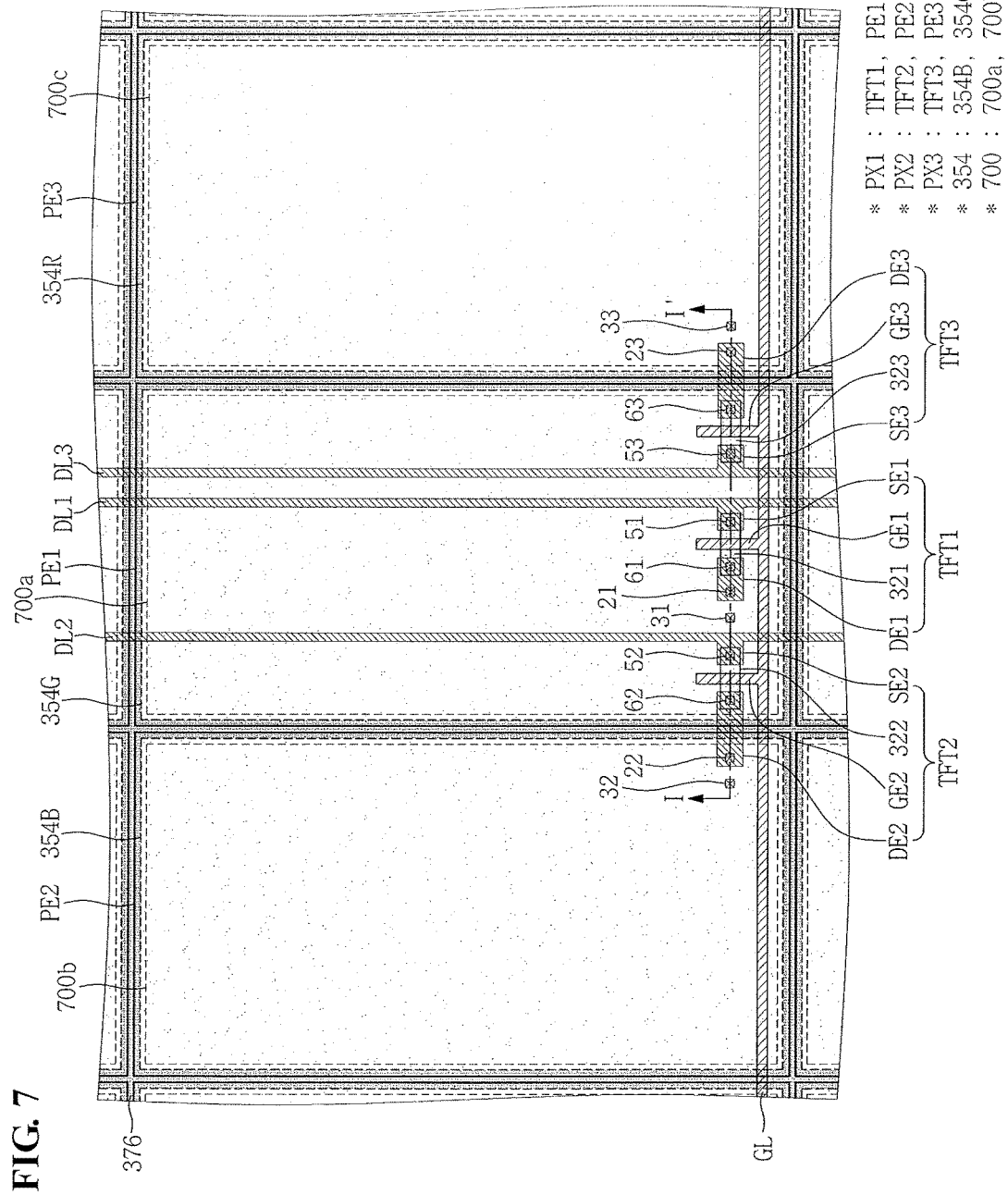
FIG. 7 illustrates another embodiment of a display device.
Figure 8:
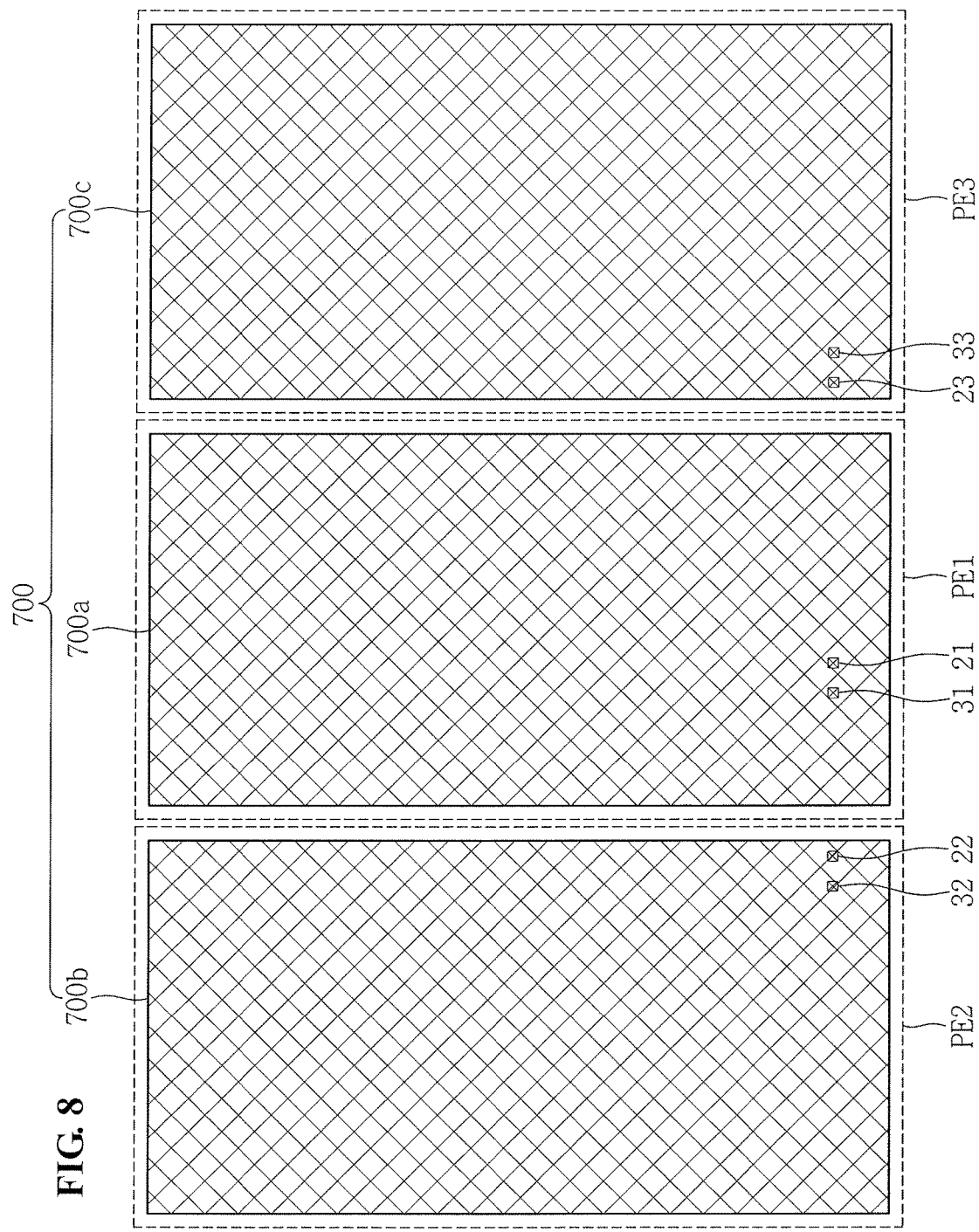
FIG. 8 illustrates a view taken along section line I-I' in FIG. 7.
Figure 9:
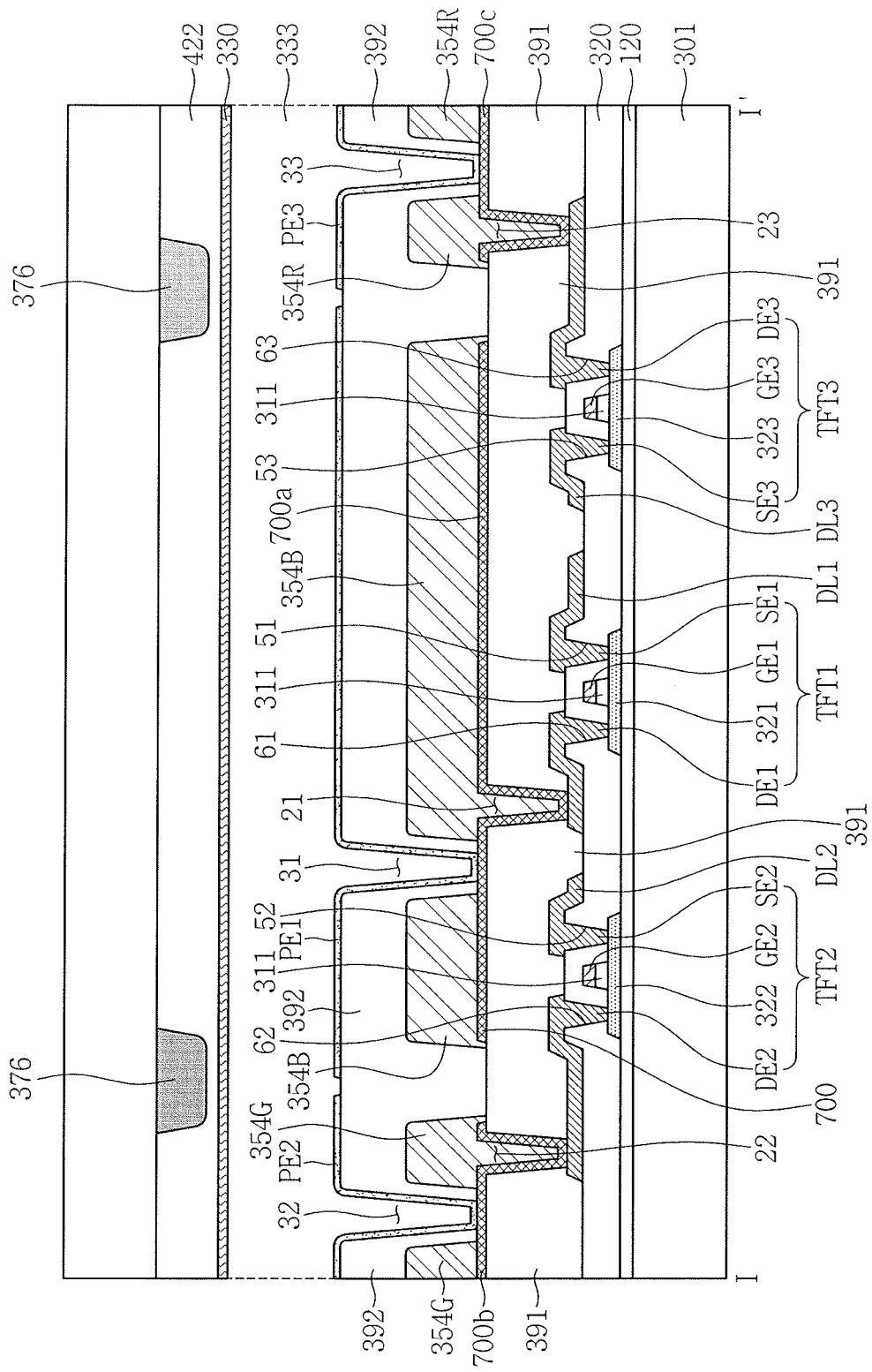
FIG. 9 illustrates an embodiment of reflective and pixel electrodes of FIG. 7.

FIG. 7 illustrates another exemplary embodiment of a display device. FIG. 8 illustrates a cross-sectional view taken along line I-I' in FIG. 7. FIG. 9 separately illustrates reflective electrode 700 and pixel electrodes PE1, PE2, and PE3 in FIG. 7. The first, second, and third pixel electrodes PE1, PE2, and PE3 are illustrated in FIG. 9 to better describe an example of a shape of the reflective electrode 700, and to facilitate understanding of an example of an overall shape of the reflective electrode 700. The first, second, and third pixel electrodes PE1, PE2, and PE3 correspond to a dotted line.

Referring to FIGS. 7, 8, and 9, the display device includes a plurality of pixels, a plurality of gate lines GL1 and GL2, a plurality of data lines DL1, DL2, and DL3, a buffer layer 120, a gate insulating layer 311, an insulating interlayer 320, a first organic layer 391, a reflective electrode 700, a color filter layer 354, a second organic layer 392, a plurality of pixel electrodes PE1, PE2, and PE3, a second substrate 302, a light blocking layer 376, an overcoat layer 422, a common electrode 330, and a liquid crystal layer 333.

A first pixel PX1 includes the pixel electrode PE1 in an intermediate portion, a second pixel PX2 includes the pixel electrode PE2 on a left side, and a third pixel PX3 includes a pixel electrode PE on a right side in FIG. 7.

The plurality of gate lines GL1 and GL2, the data lines DL1, DL2, and DL3, the buffer layer 120, the gate insulating layer 311, the insulating interlayer 320, the first organic layer 391, the color filter layer 354, the second organic layer 392, the pixel electrodes PE1, PE2, and PE3, the second substrate 302, the light blocking layer 376, the overcoat layer 422, the common electrode 330, the liquid crystal layer 333 in FIGS. 7 and 8 may be the same as in FIGS. 1, 2, 4, and 5.

The reflective electrode 700 in FIGS. 7 and 8 includes a plurality of unit reflective electrodes 700a, 700b, and 700c. The unit reflective electrode 700a, 700b, and 700c are electrically separated from one another.

The unit reflective electrodes 700a, 700b, and 700c correspond and are independently connected to the pixel electrodes PE1, PE2, and PE3, respectively. In addition, the unit reflective electrodes 700a, 700b, and 700c are independently connected to respective switching elements TFT1, TFT2, and TFT3 of the pixels PX1, PX2, and PX3, respectively. For example, as illustrated in FIG. 7, the first unit reflective electrode 700a corresponds to the first pixel electrode PE1, the second unit reflective electrode 700b corresponds to the second pixel electrode PE2, and the third unit reflective electrode 700c corresponds to the third pixel electrode PE3.

The first unit reflective electrode 700a is connected to the first pixel electrode PE1 and the first switching element TFT1. The second unit reflective electrode 700b is connected to the second pixel electrode PE2 and the second switching element TFT2. The third unit reflective electrode 700c is connected to the third pixel electrode PE3 and the third switching element TFT3. Thus, the first unit reflective electrode 700a connects a first drain electrode DE1 of the first switching element TFT1 and the first pixel electrode PE1. The second unit reflective electrode 700b connects a second drain electrode DE2 of the second switching element TFT2 and the second pixel electrode PE2. The third unit reflective electrode 700c connects a third drain electrode DE3 of the third switching element TFT3 and the third pixel electrode PE3.

The first unit reflective electrode 700a is connected to the first drain electrode DE1 through a first lower contact hole 21 of the first organic layer 391. The second unit reflective electrode 700b is connected to the second drain electrode DE2 through a second lower contact hole 22 of the first organic layer 391. The third unit reflective electrode 700c is connected to the third drain electrode DE3 through a third lower contact hole 23 of the first organic layer 391.

The first pixel electrode PE1 is connected to the first unit reflective electrode 700a through a first upper contact hole 31 of the second organic layer 392. The second pixel electrode PE2 is connected to the second unit reflective electrode 700b through a second upper contact hole 32 of the second organic layer 392. The third pixel electrode PE3 is connected to the third unit reflective electrode 700c through a third upper contact hole 33 of the second organic layer 391.

The first pixel electrode PE1 is connected to the first switching element TFT1 and overlaps another switching element in addition to the first switching element TFT1. For example, as illustrated in FIG. 7, the first pixel electrode PE1 overlaps the second switching element TFT2 and the third switching element TFT3. In such an exemplary embodiment, the second switching element TFT2 and the third switching element TFT3 are connected to a data line different from a data line to which the first switching element TFT1 is connected. For example, the first switching element TFT1 is connected to the first data line DL1, the second switching element TFT2 is connected to the second data line DL2, and the third switching element TFT3 is connected to the third data line DL3. As such, the first pixel electrode PE1 connected to the first data line DL1 through the first switching element TFT1 overlaps the switching elements TFT2 and TFT3 connected to data lines DL2 and DL3 that are different from the first data line DL1.

Accordingly, the second pixel electrode PE2 does not overlap the second data line DL2 and the second switching element TFT2 connected to the second pixel electrode PE2. The third pixel electrode PE3 does not overlap the third data line DL3 and the third switching element TFT3 connected to the third pixel electrode PE3. For example, only a portion of the second drain electrode DE2 overlapping the second semiconductor layer 322 may be substantially defined as an actual second drain electrode DE2 of the second switching element TFT2. In such an exemplary embodiment, the second drain electrode DE2 of the second switching element TFT2 does not overlap the second pixel electrode PE2. For example, only a portion extending from the actual second drain electrode DE2 overlaps the second pixel electrode PE2.

Similarly, only a portion of the third drain electrode DE3 overlapping the third semiconductor layer 323 may be substantially defined as an actual third drain electrode DE3. In such an exemplary embodiment, the third drain electrode DE3 of the third switching element TFT3 does not overlap the third pixel electrode PE3. For example, only a portion extending from the actual third drain electrode DE3 overlaps the third pixel electrode PE3.

Figure 10:
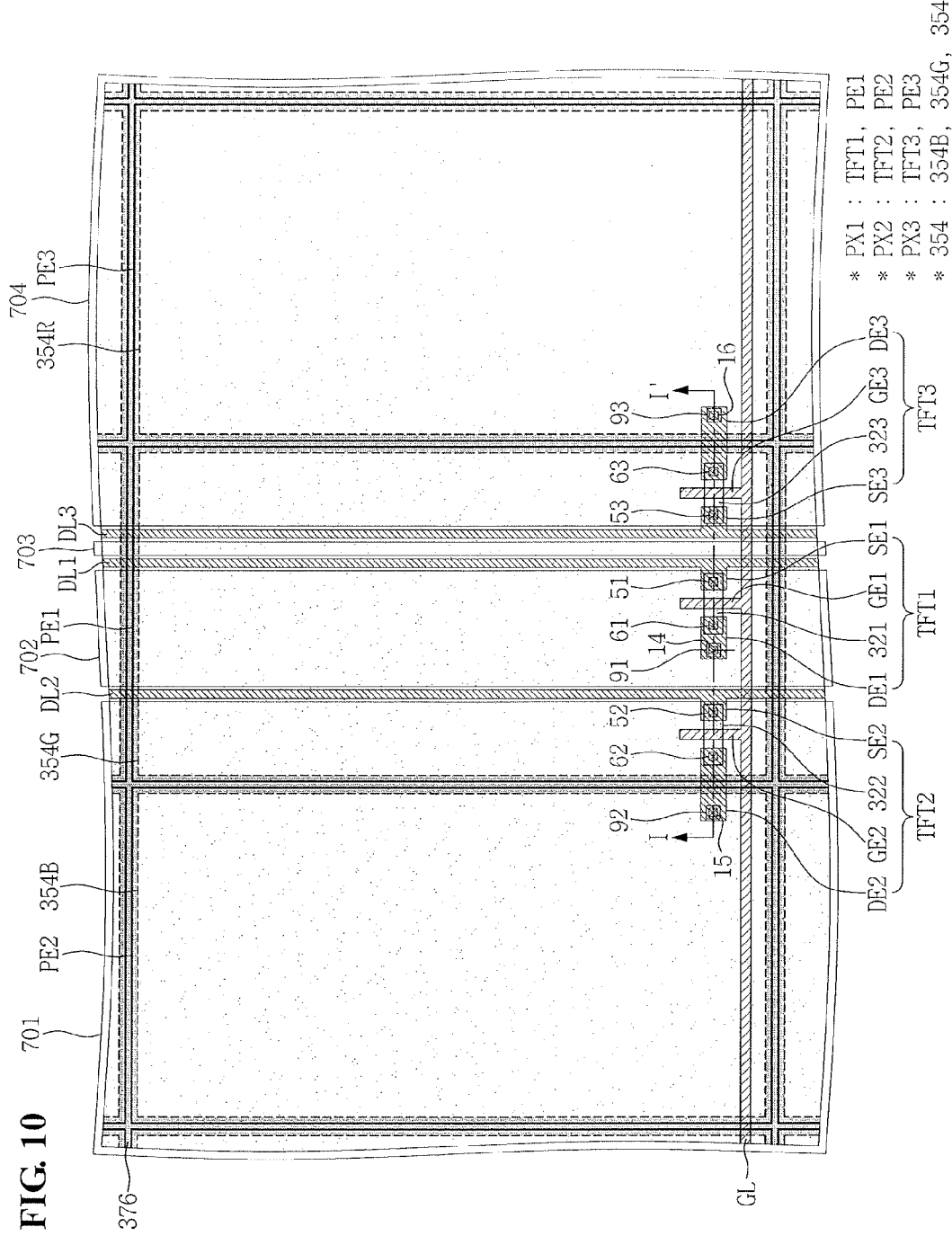
FIG. 10 illustrates another embodiment of a display device.

FIG. 10 illustrates another exemplary embodiment of a display device including a plurality of reflective electrodes 701, 702, 703, and 704 electrically separated from one another. The reflective electrodes 701, 702, 703, and 704 are disposed among adjacent ones of data lines. For example, the first reflective electrode 701 is between a second data line DL2 and another data line on a left side of the second data line DL2. The second reflective electrode 702 is between the second data line DL2 and the first data line DL1. The third reflective electrode 703 is between the first data line DL1 and the third data line DL3. The fourth reflective electrode 704 is between the third data line DL3 and another data line on a right side of the third data line DL3.

The reflective electrodes 701, 702, 703, and 704 do not overlap the first, second, and third data lines DL1, DL2, and DL3, respectively. The reflective electrodes 701, 702, 703, and 704 overlap a plurality of pixel electrodes PE1, PE2, and PE3, respectively, disposed among adjacent ones of the first, second, and third data lines DL1, DL2, and DL3. The aforementioned DC voltage may be applied to each of the reflective electrodes 701, 702, 703, and 704.

Figure 11:
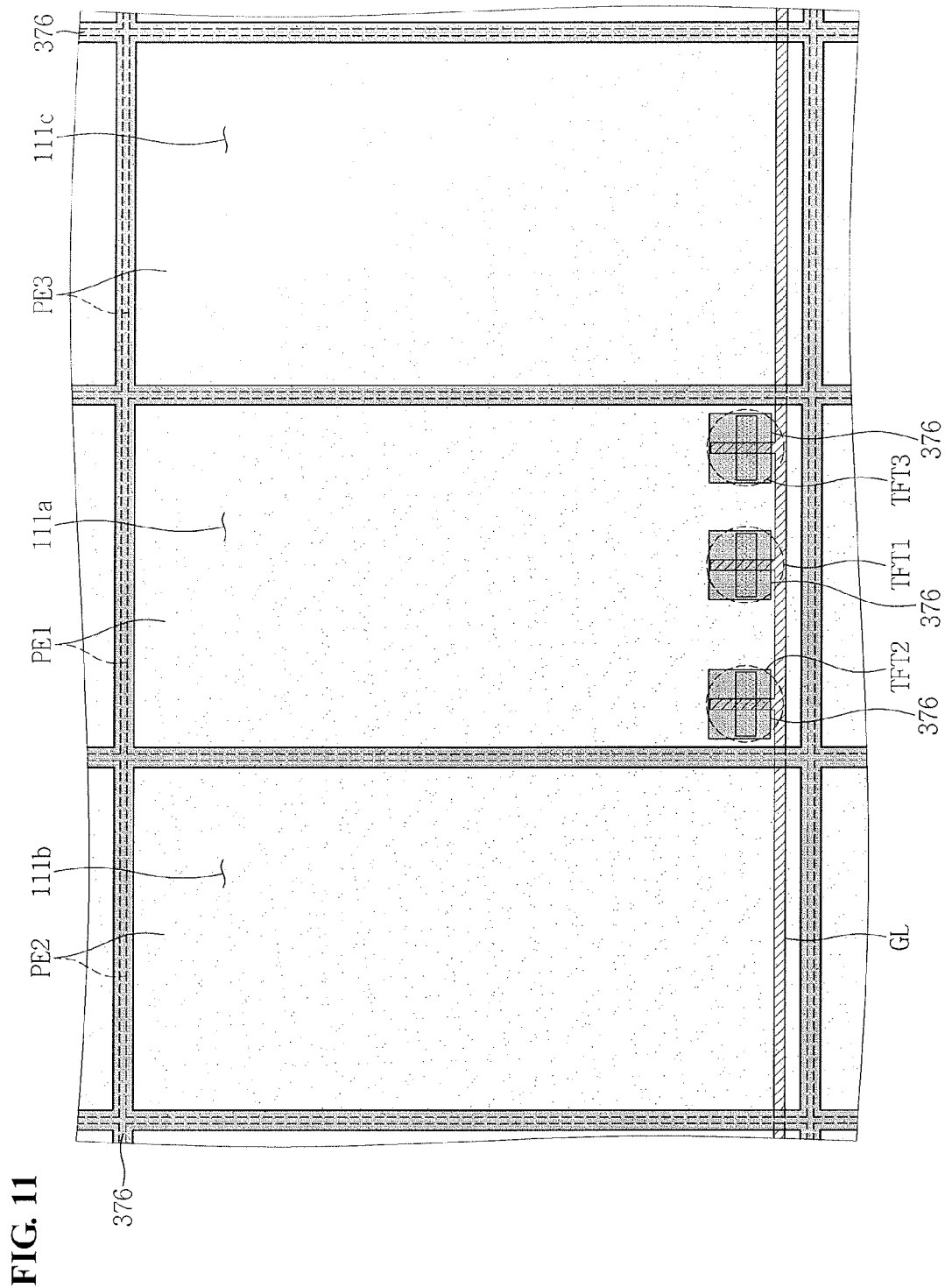
FIG. 11 is another view of FIG. 4 further illustrating the gate line, the first switching element, the second switching element, and the third switching element of FIG. 1.

FIG. 11 illustrates another embodiment of the gate line GL, the first switching element TFT1, the second switching element TFT2, and the third switching element TFT3 of FIG. 1. As illustrated in FIG. 11, the light blocking layer 376 may further overlap the first switching element TFT1, the second switching element TFT2, and the third switching element TFT3.

FIGS. 12A and 12B illustrates an example of a comparison of reflectivity between a first proposed first display device and an exemplary embodiment of a first display device. FIG. 12A illustrates several reflectivity characteristics of a white pixel W, a red pixel R, a green pixel G, and a blue pixel B of the first proposed display device. In the first proposed display device, each of the white pixel W, the red pixel R, the green pixel G, and the blue pixel B includes a switching element.

FIG. 12B illustrates several reflectivity characteristics of a white pixel W, a red pixel R, a green pixel G, and a blue pixel B of the display device of the exemplary embodiment. In the exemplary embodiment, respective switching elements of the white pixel W, the red pixel R, the green pixel G, and the blue pixel B are in the blue pixel B.

As illustrated in FIGS. 12A and 12B, an area of a dark portion of the blue pixel B in the exemplary embodiment of the display device is larger than an area of a dark portion of the blue pixel B in the first proposed display device. An area of a dark portion of each of other white, red, and green pixels W, R, and G in the exemplary embodiment of the display device is smaller than an area of a dark portion of each of other white, red, and green pixels W, R, and G in the first proposed display device. Accordingly, overall reflectivity (e.g., an overall reflectivity including the dark portion: 99%) in the exemplary embodiment of the display device is higher than overall reflectivity (e.g., an overall reflectivity including the dark portion: 97%) in the first proposed display device.

FIGS. 13A and 13B are views illustrates another comparison of reflectivity between a second proposed display device and a display device according to an exemplary embodiment. FIG. 13A illustrates several reflectivity characteristics of a red pixel R, a green pixel G, and a blue pixel B of the second proposed display device. In the second proposed display device, each of the red pixel R, the green pixel G, and the blue pixel B includes a switching element.

FIG. 13B illustrates several reflectivity characteristics of a red pixel R, a green pixel G, and a blue pixel B of the display device of the exemplary embodiment. In the exemplary embodiment, respective switching elements of the red pixel R, the green pixel G, and the blue pixel B are in the blue pixel B.

As illustrated in FIGS. 13A and 13B, an area of a dark portion of the blue pixel B in the exemplary embodiment is larger than an area of a dark portion of the blue pixel B in the second proposed display device. An area of a dark portion of each of other red and green pixels R and G in the exemplary embodiment is less than an area of a dark portion of each of other red and green pixels R and G in the second proposed display device. Accordingly, overall reflectivity (e.g., an overall reflectivity including the dark portion: 99%) in an exemplary embodiment of the display device is higher than overall reflectivity (e.g., an overall reflectivity including the dark portion: 97%) in the second proposed display device.

In accordance with one or more of the aforementioned embodiments, a switching element of at least one pixel is in another pixel adjacent to the at least one pixel. Thus, a vertical height difference (e.g., an unevenness pattern) in the at least one pixel may be reduced. Accordingly, a dark portion of the at least one pixel may be reduced. In one embodiment, switching elements of a red pixel and a green pixel are in a blue pixel, which is dark as compared to the red pixel and the green pixel. As a result, luminance of the entire display device may increase.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a first substrate spaced from a second substrate;
a gate line, a first data line, and a second data line on the first substrate;
a first switch connected to the gate line and the first data line;
a second switch connected to the gate line and the second data line;
a first pixel electrode connected to the first switch; and
a second pixel electrode connected to the second switch, the second pixel electrode adjacent to the first pixel electrode,
wherein the first gate line extends in a first direction, a first light emission area positioned corresponding to the first pixel electrode and a second light emission area positioned corresponding to the second pixel electrode are adjacent to each other in the first direction, and the second data line and the second switch are in the first light emission area.

2. The display device as claimed in claim 1, further comprising:
a light blocking layer on one of the first substrate or the second substrate,
wherein the light blocking layer defines the first light emission area of the first pixel electrode and the second light emission area of the second pixel electrode.

3. The display device as claimed in claim 2, wherein the second data line overlaps the first pixel electrode in the first light emission area.

4. The display device as claimed in claim 2, wherein the first switch is in the first light emission area.

5. The display device as claimed in claim 2, wherein the first switch and the second switch do not overlap the light blocking layer.

6. The display device as claimed in claim 1, further comprising:
   a color filter layer on one of the first substrate or the second substrate.

7. The display device as claimed in claim 6, wherein the color filter layer includes:
   a first color filter corresponding to the first pixel electrode; and
   a second color filter corresponding to the second pixel electrode.

8. The display device as claimed in claim 7, wherein the first color filter is a blue color filter.

9. The display device as claimed in claim 7, wherein the first color filter and the second color filter have different colors.

10. The display device as claimed in claim 1, wherein the first data line overlaps the first pixel electrode.

11. The display device as claimed in claim 1, wherein the first data line and the second data line do not overlap the second pixel electrode.

12. The display device as claimed in claim 1, further comprising:
   a third data line on the first substrate;
   a third switch connected to the gate line and the third data line; and
   a third pixel electrode connected to the third switch and adjacent to the first pixel.

13. The display device as claimed in claim 12, wherein the first data line is between the second data line and the third data line.

14. The display device as claimed in claim 13, wherein the third data line overlaps the first pixel electrode.

15. The display device as claimed in claim 12, further comprising:
   a light blocking layer on one of the first substrate or the second substrate,
   wherein the light blocking layer defines a first light emission area of the first pixel electrode, a second light emission area of the second pixel electrode, and a third light emission area of the third pixel electrode, and
   wherein the third data line overlaps the first pixel electrode in the first light emission area.

16. The display device as claimed in claim 12, wherein the first switch is between the second switch and the third switch.

17. The display device as claimed in claim 12, wherein the first pixel electrode is between the second pixel electrode and the third pixel electrode.

18. The display device as claimed in claim 1, further comprising:
   a reflective electrode overlapping the first pixel electrode and the second pixel electrode.

19. The display device as claimed in claim 18, wherein the reflective electrode is to receive a constant direct current voltage.

20. The display device as claimed in claim 1, further comprising:
   a first unit reflective electrode overlapping the first pixel electrode; and
   a second unit reflective electrode overlapping the second pixel electrode,
   wherein the second unit reflective electrode is electrically separated from the first unit reflective electrode.

21. The display device as claimed in claim 20, wherein:
   the first unit reflective electrode is connected to the first switch and the first pixel electrode, and
   the second unit reflective electrode is connected to the second switch and the second pixel electrode.

22. The display device as claimed in claim 1, further comprising:
   a reflective electrode between the first data line and the second data line,
   wherein the reflective electrode overlaps the first pixel electrode.

23. The display device as claimed in claim 12, wherein the first data line, the second data line, and the third data line extend completely across an interior of the first light emission area in a second direction that crosses the first direction.

* * * * *